United States Patent [19]

Inoue et al.

[11] Patent Number: 4,496,935
[45] Date of Patent: Jan. 29, 1985

[54] ANALOG-DIGITAL CONVERTER WITH LINEAR CHARACTERISTIC RESTORATION CIRCUIT

[75] Inventors: Michihiro Inoue, Ikoma; Akira Matsuzawa, Katano; Toyoki Takemoto, Yawata, all of Japan

[73] Assignee: Matsushita Electric Industrial Co., Ltd., Kadoma, Japan

[21] Appl. No.: 368,814

[22] Filed: Apr. 15, 1982

[30] Foreign Application Priority Data

Feb. 12, 1982 [JP] Japan ................................. 57-21434

[51] Int. Cl.³ ......................................... H03K 13/175
[52] U.S. Cl. ...................... 340/347 AD; 340/347 CC; 340/347 M
[58] Field of Search ................. 340/347 AD, 347 CC, 340/347 M; 357/41; 364/608

[56] References Cited

U.S. PATENT DOCUMENTS 3,689,848  9/1972  Geffe et al. .................... 330/260 X
4,041,518  8/1977  Shimizu et al. .................. 357/41 X
4,216,465  8/1980  Huelsman et al. .......... 340/347 AD Primary Examiner—T. J. Sloyan
Attorney, Agent, or Firm—Cushman, Darby & Cushman

[57] ABSTRACT

A parallel type analog-digital converter having a plural number (1023) of comparators, a first voltage divider comprising a plural number (1023) of resistors ($R_1$ to $R_{1023}$) connected in series across positive and negative terminals of a power source thereby feeding reference voltages from the junction points to the comparators, the apparatus further comprises a second voltage divider comprising a second plural number (8) of resistors ($r_1, r_2 \ldots r_8$) connected in series across the voltage feeding terminals thereby feeding input voltages to input terminals of the current amplifiers $D_1, D_2 \ldots D_8$, the output of which is given to the corresponding junction points of the first voltage divider, thereby to equalize voltages of said first voltage divider with voltages of corresponding junction points of said second voltage divider.

5 Claims, 6 Drawing Figures

ANALOG-DIGITAL CONVERTER WITH LINEAR CHARACTERISTIC RESTORATION CIRCUIT

BACKGROUND OF THE INVENTION

1. Field of the Technology

The present invention relates to a parallel type analog-digital converter capable of accurate and high speed analog-digital (hereinafter referred to as A/D) conversion.

An exemplary conventional parallel type analog-digital converter is constructed as shown in FIG. 1 to comprise comparators $C_1, C_2 \ldots C_{1023}$, the number of comparators being determined by the designed quantum levels, (that is in the case of 10 bit conversion the number of converter is $2^{10}-1=1023$). The comparators $C_1, C_2 \ldots$ receive input analog signals on one of their input terminals, given through the input terminal $V_{in}$, and on the other of their input terminals, each comparator receives different reference voltages from a voltage divider composed of series connected resistors $R_1, R_2 \ldots R_{1023}$ connected across positive and negative power source terminals $V_{RH}$ and $V_{RG}$ of the voltages $V_{RH}$ and $V_{RG}$, respectively, the voltages being selected so as to be those of quantized levels. By such construction, all the comparators compare the input voltages with respective quantized levels of the reference voltages, in parallel and at the same time. Then, the output signals of the comparators $C_1, C_2 \ldots$ are given to an encoder 1 which may include gate circuits for respective comparators $C_1, C_2 \ldots$. And the encoded output is given to the output circuit 2 for conversion of the output levels. In the exemplary A/D converter as shown in FIG. 1, the resistors $R_1$ to $R_{1023}$ of the divider circuit have been of equal value, so that quantized voltage levels of equal voltage differences inbetween are produced, if the input current to the comparators $C_1$ to $C_{1023}$ would be negligibly small.

That is, if the current to flow into the comparators is negligibly small, the current $I_R$ in the series resistors $R_1$ to $R_{1023}$ is given as (provided that resistances thereof are equal and of the value R):

$$I_R = \frac{V_{RH} - V_{RG}}{(2^n - 1)R}; \tag{0}$$

where n is the number of bits of the converted signal, and in this example, n=10. In this case, the voltages $V_{RX}$ given to the comparator input terminals from the X-th junction point of the voltage divider circuit are on a straight line (dotted line) on a graph shown in FIG. 2 and showing a $V_{RX}$ vs. serial number X relation.

However, in an actual converter, there are considerable input currents $I_i$ given to the input terminals of the comparators from the voltage divider circuit, and therefore the actual $V_{RX}$ vs. X curve becomes a curve as shown by a solid line in FIG. 2.

That is, the voltage $V_{RX}$ of the input terminal of the X-th comparator is given as $$V_{RX} = (V_{RH} - V_{RG}) - R \cdot I_i \left( 2^n \cdot X - \frac{X(X+1)}{2} \right) - R \cdot I_R \cdot X \tag{1}$$

wherein $1 \leq X \leq 2^n/2$.

On the other hand, in the case of the dotted line (ideal case where $I_i=0$), the voltage $V_{RXO}$ of the input terminal of the X-th comparator is given as $$V_{RXO} = (V_{RH} - V_{RG}) - R \cdot I_R \cdot X \tag{2},$$

wherein $1 \leq X \leq 2^n/2$.

Accordingly, the voltage difference $\Delta V_{RX}$ between the two voltage $V_{RXO}$ and $V_{RX}$, which is the error between the ideal design for $I_i=0$ and actual case, where the currents $I_i$ are not negligibly small, is given as $$\Delta V_{RX} = R \cdot I_i \left( 2^n \cdot X - \frac{X(X+1)}{2} \right), \tag{3}$$

where $1 \leq X \leq 2^n/2$.

On the other hand in the range of X of $$2^n/2 \leq X \leq 2^n,$$

the voltage difference $\Delta V_{RX}$ should be represented as $$\Delta V_{RX} = \Delta V_{Ry} \tag{4},$$

where $y = 2^n - X$.

In the equation (3), at the value of $$X = 2^n/2$$

the voltage difference $\Delta V_{RX}$ becomes maximum which is $$\Delta V_{RX} = \frac{1}{2} \cdot R \cdot I_i (2^{2n} - 2^{2n-2} - 2^{2n-1}) \tag{5}.$$

In order to fulfil a lineality condition as an A/D converter, the error should be $\frac{1}{2}$ LSB, (LSB is a value of the last sign bit, or quantum value), accordingly, $$\Delta V_{RX} \leq \frac{1}{2} LSB = \frac{1}{2} R \cdot I_R \tag{6}.$$

From the equations (5) and (6), the ratio $I_R/I_i$ should fulfil the following condition:

$$I_R/I_i \geq 2^{2n} - 2^{2n-2} - 2^{n-1} \tag{7}.$$

Now, provided that $I_i = 1$ μA, the current $I_R$ for the 10 bit A/D converter becomes as large as $I_R = 786$ mA. accordingly, when $V_{RH} - V_{RG} = 2V$, (that is the peak to peak voltage of the analog input signal is 2 $V_{pp}$), then the resistance of each resistors $R_X$ must be as low as $2.5 \times 10^{-3} \Omega$ in order to fulfill the above condition (7). Realization of such low resistances is not feasible, and moreover, the power consumption of the circuit is likely to become impractically large. In order to overcome such a problem, one solution may be to decrease the bias currents of the comparators. But a drastic decrease in the bias current can not be made in the case where the comparators for a high speed A/D converter are formed by emitter-coupled logic circuits. In that case the comparators are formed by using MOS transistors, the bias current can be made almost zero, but such MOS transistors have large offset voltages, and therefore an A/D converter of a very large bit number can not be formed.

Another proposal has been made to obtain an A/D converter as shown in FIG. 3, that is the reference power source for feeding current to the reference resistors is formed as a feed-back circuit in order to reduce the error due to the bias currents. In the circuit of FIG. 3, the encoder 1, comparators $C_1$ to $C_n$ and divider circuit $R_1, R_2, R_3 \ldots R_n$ are the same as those designated by the same numeral and marks. A feed-back circuit 101 detects the voltage at the junction between the resistor $R_{n-1}$ and $R_n$ and feeds a current to the series connection of the resistors $R_1$ to $R_n$, in a manner to equalize the voltage of the junction point with the reference voltage $V_{ref}$. However, the problem in this circuit is that the output current of the feed-back circuit 101 is fed to all the series resistors $R_1$ to $R_n$ of the divider circuit and, the higher the accuracy required the larger the current that is required.

SUMMARY OF THE INVENTION

Therefore, the present invention provides an A/D converter capable of high accuracy conversion without the use of a large current. The high accuracy conversion is feasible even if the bit number in the conversion is large. The A/D converter in accordance with the present invention is capable of high accuracy conversion without losing its high speed characteristics. Furthermore, the adjustment of the A/D converter according to the present invention is very easy.

DESCRIPTION OF THE PREFERRED EMBODIMENT

A parallel type analog-digital converter in accordance with the present invention comprises a plural number of resistors connected in series across voltage feeding terminals to feed divided voltages as reference voltages from junction points between the resistors to the comparators, and is improved by further comprising a second voltage divider comprising a plural number of resistors connected in series across voltage feeding terminals thereby to feed divided voltages from junction points between the resistors, current amplifiers for feeding compensation currents to selected ones of junction points of the first voltage divider thereby to equalize voltages of the junction points of the first voltage divider with the voltages of corresponding junction points of the second voltage divider.

Figure 1:
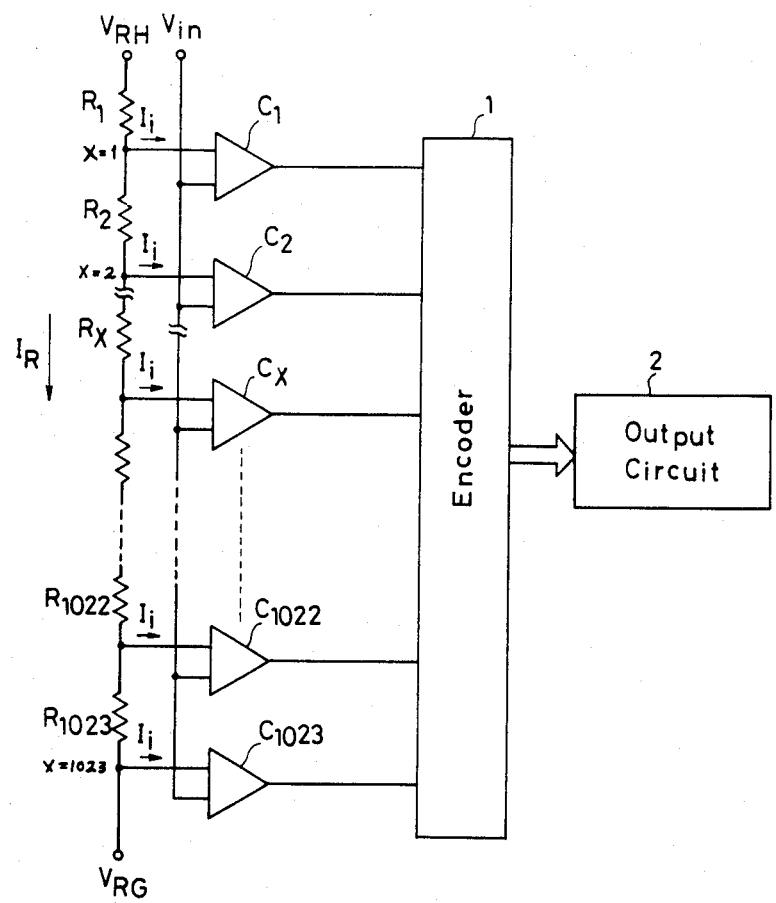
FIG. 1 is a circuit diagram of a conventional A/D converter.

A feature of the parallel type A/D converter of the present invention is that a first power source for supplying current across both ends of the voltage divider or series resistors $R_1, R_2, R_3 \ldots$ is provided in the same manner as that of FIG. 1, and besides, a suitable number of other voltage sources for compensating reference voltages of the comparators are provided at several midway junction points of the series resistors.

Figure 2:
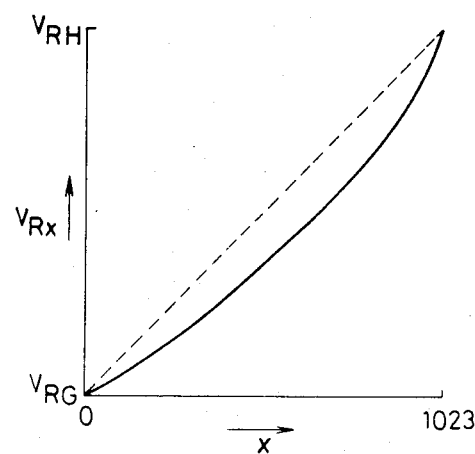
FIG. 2 is a graph showing a relation between output voltages and serial numbers of terminals of the voltage divider circuit of FIG. 1.
Figure 3:
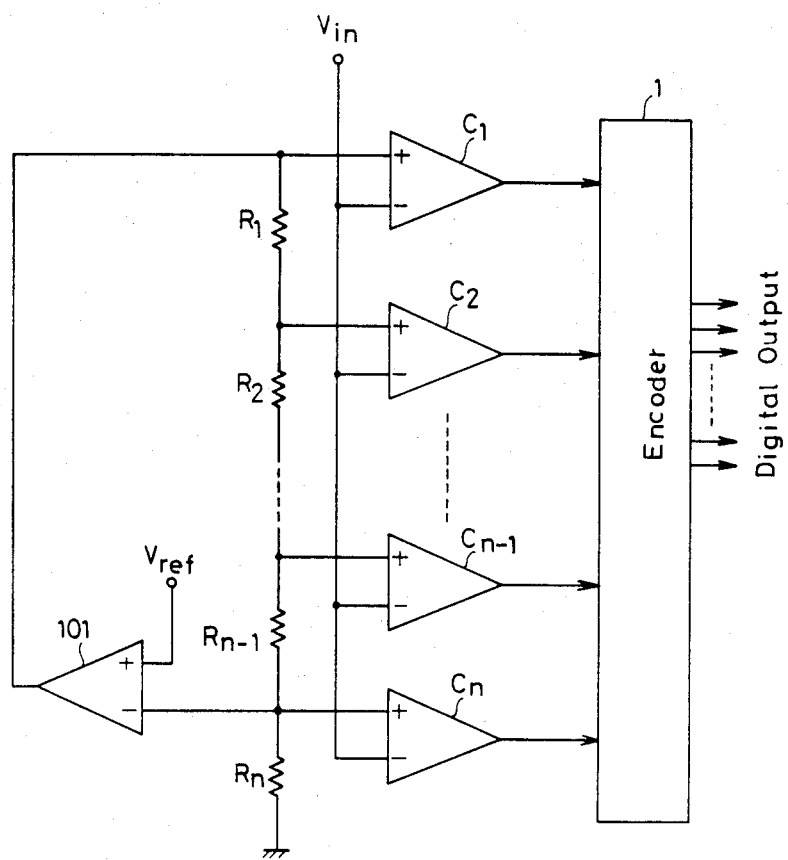
FIG. 3 is a circuit diagram of another conventional A/D converter.
Figure 4:
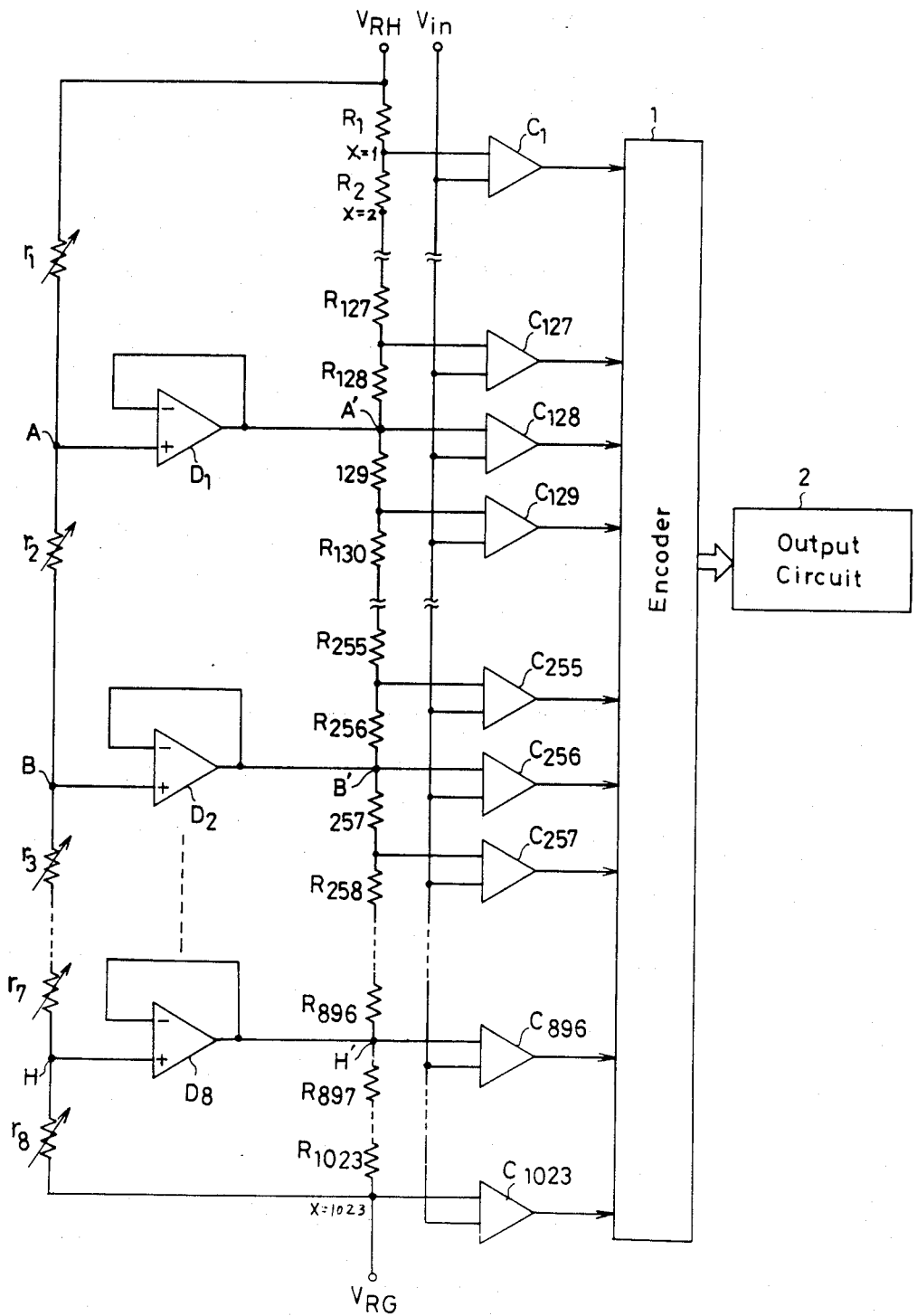
FIG. 4 is a circuit diagram of an example embodying the present invention.
Figure 5:
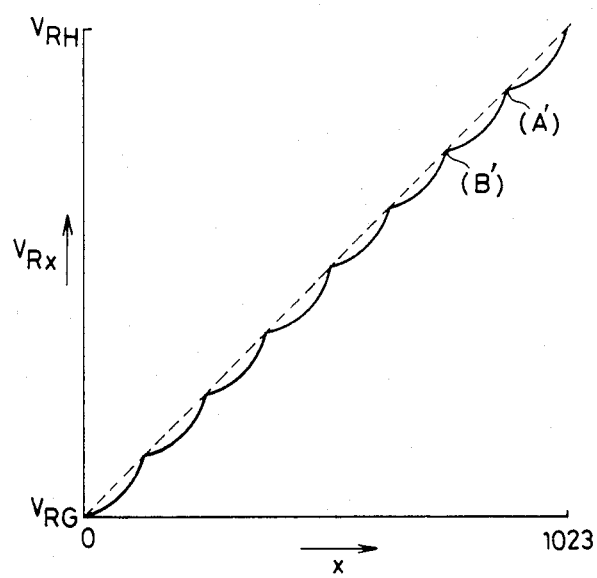
FIG. 5 is a graph showing a relation between output voltages and serial numbers of terminals of the voltage divider of FIG. 4.

A concrete example, embodying the present invention is elucidated with reference to FIG. 4 and subsequent figures. The converter comprises a number of comparators $C_1, C_2 \ldots C_{1023}$ of the number according to designed for quantum levels, (that is in the case of 10 bits conversion the number of the converter is $2^{10}-1=1023$). The comparators $C_1, C_2 \ldots$ receive input analog signals on one of their input terminals given through the input terminal $V_{in}$, and on the other of their input terminals each comparator receives different reference voltages from a voltage divider composed of series connected resistors $R_1, R_2 \ldots R_{1023}$ connected across positive and negative power source terminals $V_{RH}$ and $V_{RG}$ of the voltages $V_{RH}$ and $V_{RG}$, respectively, the voltages being selected so as to be those of quantized levels. By such construction, all the comparators compare the input voltages with respective quantized levels of the reference voltages, in parallel and at the same time. Then, the output signals of the comparators $C_1, C_2 \ldots$ are given to an encoder 1 which may include gate circuits for respective comparators $C_1, C_2 \ldots$. And the encoded output is given to the output circuit 2 for conversion of the output levels. In the exemplary A/D converter, shown in FIG. 1, the resistors $R_1$ to $R_{1023}$ of the divider circuit have been of equal value, so that quantized voltage levels of equal voltage differences inbetween are produced, if the input current to the comparators $C_1$ to $C_{1023}$ is negligibly small. A set of series connected variable resistors $r_1, r_2, r_3, r_4, r_5, r_6, r_7$ and $r_8$ are also connected across the power source terminals $V_{RH}$ and $V_{RG}$. Then current amplifiers $D_1, D_2 \ldots$ are connected across intermediate junction points A, B ... of the series connected variable resistors $r_1, r_2, r_3 \ldots r_8$ and corresponding intermediate junction points A', B' ... of the series connected resistors $R_1, R_2, R_3 \ldots R_{1023}$. That is, to seven intermediate junction points A', B', C' ... of the series connected resistors $R_1, R_2 \ldots R_{1023}$, compensation currents are fed by the current amplifiers $D_1, D_2 \ldots D_7$, so as to minimize voltage falls of the input reference voltages to the comparator circuits $C_{128}, C_{256} \ldots C_{896}$. Provided that, $r_1, r_2, r_3 \ldots r_8$ have equal resistances between each other and by selecting the input current of the current amplifiers $D_1, D_2, D_3 \ldots D_8$ to be negligibly small, then the power source voltage $V_{RH}-V_{RG}$ across the terminals $V_{RH}$ and $V_{RG}$ is equally divided by the eight variable resistors $r_1$ to $r_8$, and the voltage at the point A is $\frac{7}{8}(V_{RH}-V_{RG})$. Due to the existence of bias currents or input currents to the comparators the voltage of the junction point A' has been lower than the voltage $\frac{7}{8}(V_{RH}-V_{RG})$ as shown in FIG. 2. However, the current amplifiers $D_1$ to $D_8$ provide currents to the junction points A', B' ... H', and accordingly the voltages of the points A', B', C' ... H' are raised to voltages of the A, B, C ... H, respectively, as shown in FIG. 5. The variable resistors $r_1, r_2 \ldots r_8$ are adjusted in such a manner that the voltages of the former points become equal to the latter points as shown in FIG. 5. Slight voltage differences remain between the eight points of A', B' ... H', but the differences are negligibly small, since as shown by the equation (7) the maximum differences are nearly proportional to squares of the quantizing number. Accordingly, differences become very small for example in the present case where the quantizing number 1024 is divided into eight parts. That is, when the differences are intended to become less than ½ LSB, this becomes sufficiently feasible since the resistances $R_1$ to $R_{1023}$ then can be selected sufficiently large in comparison with the aforementioned $2.5 \times 10^{-3} \Omega$ of the conventional case. In this example since the number of quantum levels or the number of the comparators in each divided range or segment is 128, the number n of the equation (5) is n=7, and therefore, from the equation (7) $I_R = 12.2$ mA for $I_i = 1$ μA.

The above-mentioned $I_i$ and $I_R$ are given by selecting the resistances of $R = R_1 = R_2 = \ldots R_{1023}$ about $0.16\Omega$, and such value is obtainable when using metal resistors. When the dividing number is increased to 16, the number of the comparators or number of quantum levels becomes 64 and the number n of the equation (5) is n=6, therefore the $I_R = 3.04$ mA and the required resistance of the resistors $R_1, R_2 \ldots R_{511}$ of the first voltage divider circuit is $0.64\Omega$, which is 256 times as large as those required if there is no current compensation by the current amplifiers.

Figure 6:
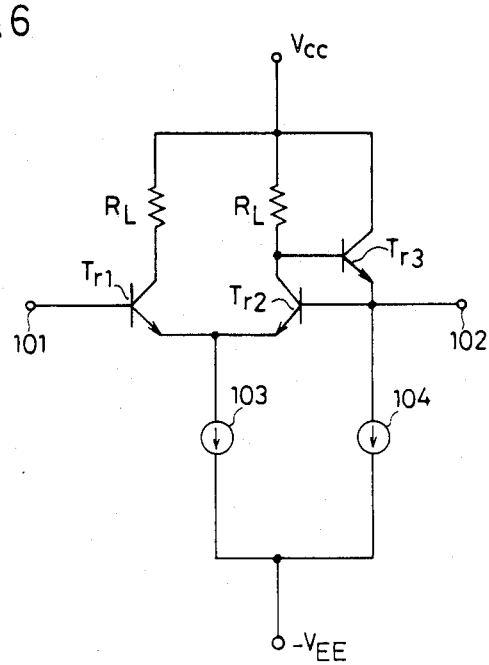
FIG. 6 is a circuit diagram of a concrete example of a current amplifier for use in the A/D converter of the present invention.

The current amplifiers $D_1, D_2 \ldots$ may be constructed as shown in FIG. 6, wherein transistors $Tr_1$ and $Tr_2$ form a differential amplifier, transistor $Tr_3$ is connected as an emitter follower transistor and $R_L$ is a load. The input terminal 101 corresponds to the + input terminal of the current amplifiers $D_1, D_2 \ldots$ of FIG. 4, and the output terminal 102 corresponds to the output terminals of the current amplifiers of FIG. 4. The circuit of FIG. 6 comprises constant current circuit 103 and 104, and positive and negative fed terminals $V_{CC}$ and $-V_{EE}$, respectively are for connection to positive and negative power source supply terminals. The circuit of FIG. 6 operates when both the transistors $Tr_1$ and $Tr_2$ have the same characteristics, in a manner such as to equalize the voltages of the terminals 101 and 102. Therefore the current amplifier circuit serves to equalize the voltages of the corresponding junction point pairs A and A', B and B', C and C' . . . H and H', with each other. In general, the temperature dependencies of the pair of transistors $Tr_1$ and $Tr_2$ in an IC are almost equal with each other, and it is thus feasible to realize a voltage divider circuit having the characteristic of the solid curve of FIG. 5.

In the above-mentioned elucidation, the resistors $r_1, r_2, r_3 \ldots r_8$ of the second voltage divider are explained to have the same resistances. But in an actual apparatus, to obtain accurately equal resistances is very difficult, though voltage differences from the designed ones at the junction points A, B, C . . . H should be sufficiently small, namely less than ½ LSB. Therefore, provided that the required quantum level is 10 bits and that the input dynamic range is 2 $V_{pp}$, then ½ LSB ≈ 1 mV; this requires that voltage differences at respective junction points should be 1 mV or less. Besides, even though the voltage differences are less than ½ LSB, when current amplifiers of $D_1, D_2 \ldots$ have offset, the voltages of the input terminal 101 and that of the output terminal 102 do not become equal. Therefore, compensation of the voltages of the junction points A', B', C' . . . H' are not accurately made even though the resistances $r_1, r_2 \ldots r_8$ are made accurately equal.

In order to overcome the above-mentioned difficulty, the resistors $r_1, r_2, r_3 \ldots r_8$ should be adjusted by, for instance, the trimming of the resistors on the IC. When the parallel type A/D converter of FIG. 4 is formed by a monolithic IC construction, the first voltage divider resistors $R_1, R_2 \ldots R_{1023}$ may be formed by aluminum film, but it is difficult to form the second voltage divider resistors $r_1, r_2, r_3 \ldots r_8$ by the aluminum film since trimming adjustment by use of laser film is difficult due to high reflection of the aluminum film. Therefore, the second voltage divider resistors $r_1, r_2 \ldots r_8$ should be preferably made by using a substance to be formed easily and to be trimmed easily, and a polycrystalline silicon film is, therefore, suitable for making the second voltage divider resistors. The sheet resistance or resistance per area of the polycrystalline film may have a considerable effect on the accuracy of the A/D converter. The polycrystalline silicon has both positive and negative type temperature characteristics depending on the condition of forming and the amount of impurity contained. Therefore, it is desirable to select the condition of the forming in such a manner that the polycrystalline film is formed to have a small temperature characteristic, which is around zero value, that is usually at the boundary region between the positive region and the negative region of the temperature characteristics. Use of such polycrystalline film for resistors $r_1, r_2 \ldots r_8$, results in accurate adjustable resistors having low temperature characteristics, and furthermore, the temperature dependency of the accuracy can be minimized.

Experimental study shows that, when a polysilicon film is formed to have a thickness of about 3000 Å by use of CVD carried out at a temperature of about 700° C. and, subsequently, boron is deposited by an ion-implantation method and driven-in in an atmosphere of 1000° C. $N_2$, thereby controlling the boron atom number, so as to obtain the sheet resistance of about 300 $\Omega/\square$, then the smallest temperature dependency of the second voltage divider resistors $r_1, r_2 \ldots r_8$ is achieved. By forming the resistors $r_1, r_2 \ldots r_8$ with the 300 $\Omega/\square$ polycrystalline silicon film and adjusting the resistors $r_1, r_2 \ldots r_8$ by a laser light trimming method in a manner that the over all linearity characteristic of the A/D converter is substantially ½ LSB, a satisfactory accuracy of the converter is obtainable, where quantized voltages, i.e., voltages of junction points of the first voltage divider $R_1, R_2 \ldots R_{1023}$ can be compensated as shown by the solid curve in FIG. 5. Therefore, by compensation of the quantized voltages at every eight junction points, the accuracy of the converter output is improved, and the resistances of the resistors may be formed in reasonable realizable values, and the current which flows in the reference resistors $R_1, R_2, R_3 \ldots R_{1023}$ or voltage divider can be reduced.

What is claimed is:

1. In a parallel type analog-digital converter having a plural number of comparators, a first voltage divider comprising a plural number of resistors connected in series across voltage feeding terminals thereby to feed divided voltages as reference voltages from junction points between the resistors to said comparators, said converter further comprising:

a second voltage divider comprising a plural number of resistors connected in series across said voltage feeding terminals for feeding divided voltages from junction points between the resistors, each junction point of said second voltage divider corresponding to selected ones of the junction points of said first voltage divider so that the corresponding junction points of the first voltage divider divide the first voltage divider into equal parts, said second voltage divider being connected in parallel with said first voltage divider, current amplifiers for feeding compensation currents to said selected ones of the junction points of said first voltage divider thereby to equalize voltages of said junction points of said first voltage divider with the voltages of corresponding junction points of said second voltage divider.

2. A parallel type analog-digital converter in accordance with claim 1, wherein each of said current amplifiers comprises
a differential amplifier and
an emitter follower circuit connected in a manner to feed-back its output to one input terminal of said differential amplifier.

3. A parallel type analog-digital converter in accordance with claim 1, wherein
said resistors of said second divider circuit are variable resistors and adjustable by trimming for compensating for offsets of said comparators and said current amplifiers and for errors of said first divider.

4. A parallel type analog-digital converter in accordance with claim 3, wherein each of said current amplifiers comprises
a differential amplifier and
an emitter follower circuit connected in a manner to feed-back its output to one input terminal of said differential amplifier.

5. A parallel type analog-digital converter in accordance with claim 3, wherein
said second divider circuit resistors are formed of polycrystalline silicon film.

* * * * *